| | | | |
|---|---|---|---|
| (12) | United States Patent | (10) Patent No.: | US 6,187,601 B1 |
| | Hu et al. | (45) Date of Patent: | Feb. 13, 2001 |

(54) PLASTIC ENCAPSULATED IC PACKAGE AND METHOD OF DESIGNING SAME

(75) Inventors: Jun Min Hu, Canton; Yi-Hsi Pao, Livonia, both of MI (US)

(73) Assignee: Ford Global Technologies, Inc., Dearborn, MI (US)

( * ) Notice: Under 35 U.S.C. 154(b), the term of this patent shall be extended for 0 days.

(21) Appl. No.: 09/021,732

(22) Filed: Feb. 11, 1998

Related U.S. Application Data

(62) Division of application No. 08/796,991, filed on Feb. 7, 1997, now Pat. No. 5,773,877.

(51) Int. Cl.[7] .......................... G01R 31/26; H01L 21/66; H01L 21/44; H01L 21/48; H01L 21/50
(52) U.S. Cl. ............................ 438/15; 438/112; 438/106; 438/127
(58) Field of Search .................................. 438/106, 127, 438/112, 15

(56) References Cited

U.S. PATENT DOCUMENTS

| | | |
|---|---|---|
| 3,560,813 | * 2/1971 | Phy . |
| 4,468,411 | * 8/1984 | Sloan et al. . |
| 4,866,506 | 9/1989 | Nambu et al. . |
| 5,182,630 | 1/1993 | Omi et al. . |
| 5,313,102 | 5/1994 | Lim et al. . |

* cited by examiner

Primary Examiner—John F. Niebling
Assistant Examiner—Josetta I. Jones
(74) Attorney, Agent, or Firm—Jennifer Stec; Roger L. May

(57) ABSTRACT

A method for designing an IC package having a plastic encapsulated portion and a lead frame portion that are bonded together at a bonding interface includes selecting material candidates for each of the plastic encapsulated portion and the lead frame portion to obtain possible material combinations. A peeling stress and a shear stress at the bonding interface for each possible material combination is determined. A design material combination from all of the possible material combinations is then selected based on a singularity parameter and stress intensity factors of the peeling stress and the shear stress. To enhance the IC package, a circular fillet feature having a radius is added to a singularity point at the bonding interface of the IC package to reduce the stress at the singularity point. The value of the radius is determined from a predefined range of radii based on the singularity parameter and stress intensity factors of the peeling stress and the shear stress at the singularity point for each of the radii.

12 Claims, 13 Drawing Sheets

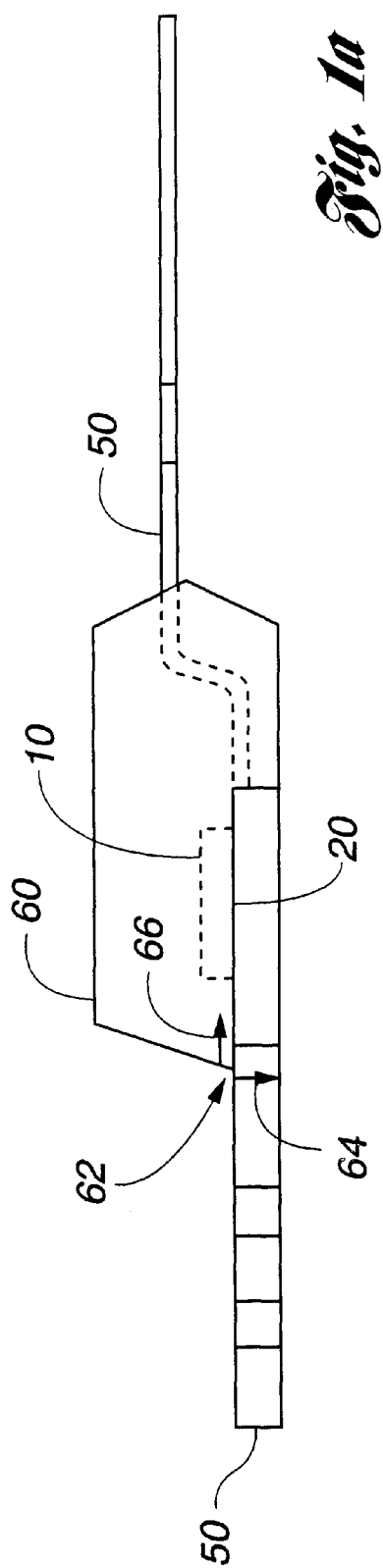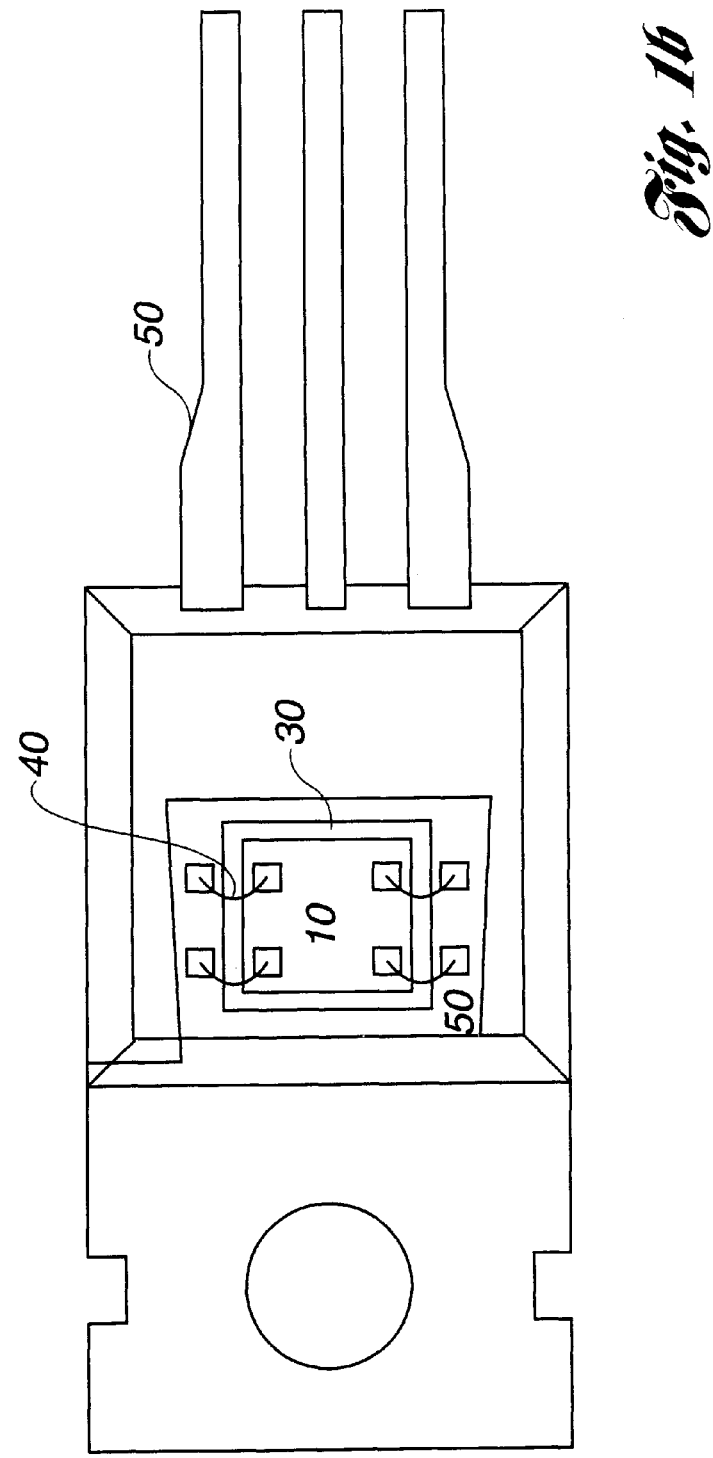

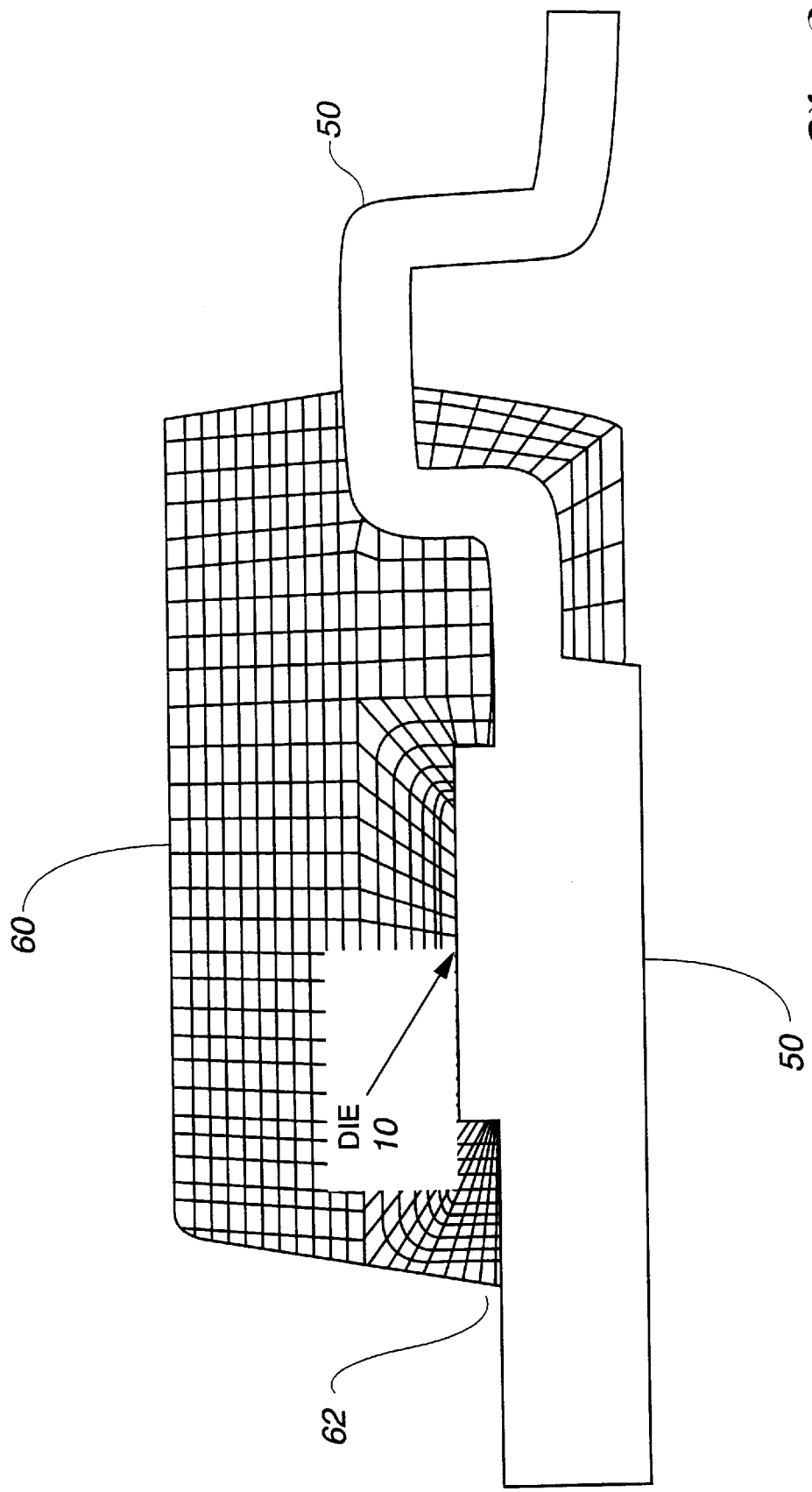

US 6,187,601 B1

PLASTIC ENCAPSULATED IC PACKAGE AND METHOD OF DESIGNING SAME

This is a divisional of application Ser. No. 08/796,991, filed on Feb. 7, 1997 now U.S. Pat. No. 5,773,879.

FIELD OF THE INVENTION

The present invention relates to a design methodology for the plastic encapsulation of power integrated circuit (IC) packages, including the selection of plastic encapsulation and lead frame materials, and the determination of the radius of the fillet feature at the bonding interface.

BACKGROUND OF THE INVENTION

As illustrated in FIGS. 1A, 1B and 2, a plastic encapsulated power IC package includes a silicon die 10, die attachment 20, passivation 30, wire interconnects 40, a lead frame 50, and plastic molding compound 60. This package is often used in automotive electronics and typically operates in a severe thermal environment.

The thermal expansion mismatch of different materials produces thermal stresses along the adhesion interface between the materials during the cooling process and during low temperature thermal cycling. In traditional plastic encapsulated IC packages, there is a sharp, angular edge at the interface between the molding compound 60 and the lead frame 50. The sharp corner of the edge causes a stress concentration which, in turn, causes crack initiation at the interface between the molding compound 60 and the lead frame 50. Such cracks in the molding compound comprise a significant reliability issue for any power IC operated in such a harsh, thermally-cycled environment.

SUMMARY OF THE INVENTION

An objective of the present invention is to develop a methodology for designing the encapsulation of the power IC packages to include a circular fillet feature. The methodology covers: (1) the selection of the material system, including the molding compound material for encapsulation and the lead frame material, based on the stress singularity characterization in the finite element analysis; and (2) the determination of the radius of the fillet.

In carrying out the above object and other objects, features, and advantages of the present invention, a method is provided for designing an IC package having a plastic encapsulated portion and a lead frame portion that are bonded together at a bonding interface. The method includes the step of selecting material candidates for each of the plastic encapsulated portion and the lead frame portion. The method also includes the step of determining a peeling stress and a shear stress at the bonding interface for a plurality of combinations of material candidates. Finally, the method includes the step of selecting a design material combination from the plurality of combinations based on the peeling stress and the shear stress.

In further carrying out the above objects and other objects, features, and advantages of the present invention, a method is also provided for adding a circular fillet feature to the IC package. The method includes the step of determining a singularity point at the bonding interface having the highest stress. The method also includes the step of adding the circular fillet feature at the singularity point having a radius sufficient to reduce the stress.

BRIEF DESCRIPTION OF THE DRAWINGS

Other objects, feature and advantages of the invention will be apparent from studying the written description and drawings in which:

FIG. 1 illustrates a typical geometry of a plastic encapsulated power integrated circuit (IC) package;

FIG. 1A illustrates a frontal view;

FIG. 1B illustrates a top partially cut-away view;

FIG. 2 is a cross sectioned view of a plastic encapsulated IC package showing stress zones used in a finite element analysis model;

BEST MODE FOR CARRYING OUT THE INVENTION

Characterization of the Stress Singularity

In the harsh operating environment for automotive applications, power IC packages such as illustrated in FIGS. 1A, 1B and 2 are subjected to high thermal loading due to major extremes in the ambient temperatures in which the vehicle is operated, and the relatively limited cooling capacity for automotive module mounting locations. The thermal expansion mismatch of different materials used in the IC package produces high thermal stresses along all adhesion interfaces during the cooling process. One major failure of the IC package is crack initiation at an interface between the molding compound 60 and the lead frame 50. Therefore, during material selection and package design, a thermal stress analysis is often required to calculate the interfacial stress and evaluate the probability of crack initiation. The design evaluation using finite element analysis may be conducted to reduce the test cost and development time by modeling and simulating these characteristics.

Figure 3:
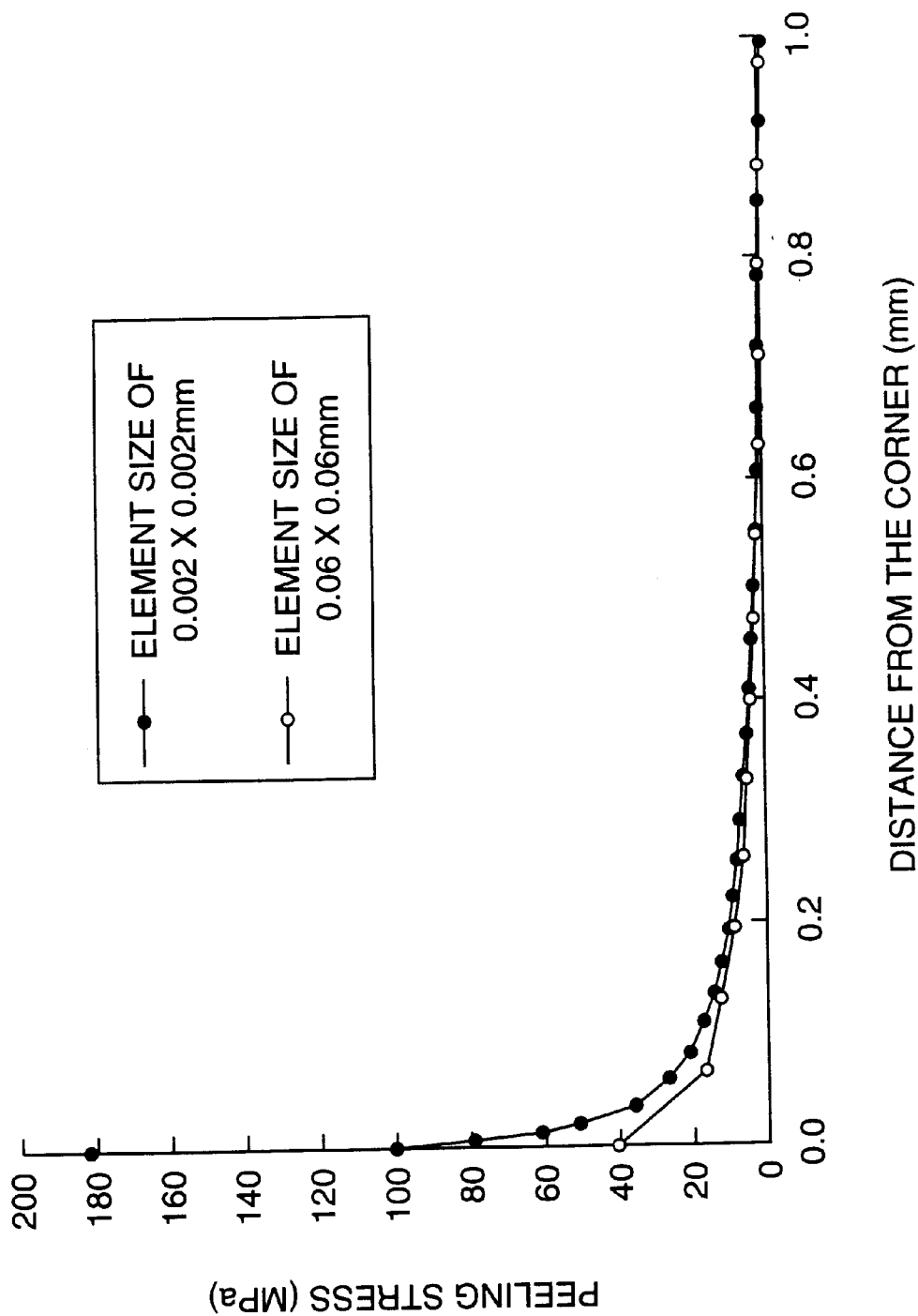
FIG. 3 is a plot of the calculated peeling stress with different element sizes.

However, the prior art approach of stress comparison may be inaccurate due to the existence of a stress singularity field. For example, the calculated stresses of the package shown in FIG. 2 along the interface of the molding compound 60 and the lead frame 50 increase dramatically when approaching a corner 62, as shown in FIG. 1A. FIG. 3 shows the distributions of the peeling stress ($s_{YY}$) calculated by a finite element model (two dimensional plane strain). For the same materials (molding compound of Hysol FP4510 [available from Hysol, Inc.] and lead frame of HSM Copper C19400 [available from Semiconductor Packaging Materials Co., Inc.]) and the same input loading (from 165° C. to 30° C.), the calculated maximum stress at the corner 62 varies as the element size is changed. The mesh size-dependent phenomenon is due to the singularity of the stress/strain field near the bonding corner 62. The singularity phenomenon may or may not exist depending on the materials and local bonding geometry. Therefore, in order to correctly evaluate a package design, the stress singularity should be characterized and considered. If the singularity phenomenon occurs at the bonding interface at corner 62, the traditional stress analysis approach will produce significant errors in the design evaluation. Therefore, the stress singularity parameter and the stress intensity factor must be used if the package design is to be robust.

According to elasticity theory, the interfacial stresses under thermal loading along the bonding interface at corner 62 can be expressed by the following equation:

$$\sigma_{ij} = \frac{K_{ij}}{r^\lambda} + L_{ij}\text{Log}(r) + \text{far field term}$$

where r is the distance from a singular point, $K_{ij}$ and $L_{ij}$ are constants, and the far field term is negligible when r is small. As used herein, the term singular point is defined as the interfacial point where stress increases dramatically and causes early failure, and is illustrated as reference numeral 62 in FIG. 1A. As a reasonable engineering approximation, the following simplified stress singularity model is proposed for the plastic encapsulated IC:

$$\sigma_{ij} = \frac{K_{ij}}{r^\lambda} \qquad r < r_{o,ij}$$

where $K_{ij}$ is the stress intensity factor, $\lambda$ is the singularity parameter, and $r_{o,ij}$ defines a zone within which the singularity dominates the stress distribution.

With respect to the possible delamination between the molding compound 60 and the lead frame 50, which results in the initiation of an interfacial crack at corner 62, the major design factors are the magnitudes of the peeling stress $s_{yy}$ and the shear stress $t_{xy}$ at the corner 62 of the bonding interface. As used herein, the term peeling stress $s_{yy}$ is defined as normal stress perpendicular to the bonding interface as illustrated by reference numeral 64, in FIG. 1A. The term sheer stress $t_{xy}$ is defined as the stress inducing the material flow deformation parallel to the bonding interface as illustrated by reference numeral 66 in FIG. 1A. Therefore, perhaps the most important objectives of the stress analysis should be to characterize the stress singularity parameter, the peeling stress intensity factor, and the shear stress intensity factor to prevent interfacial cracking.

Figure 4:
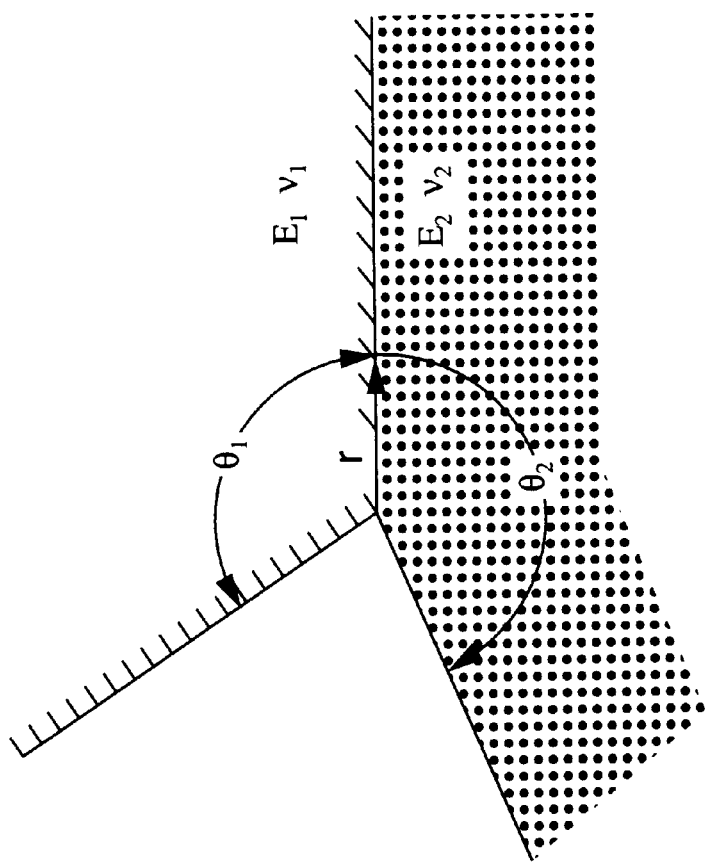
FIG. 4 is an illustration of a contact interface.

As illustrated in FIG. 4, The stress intensity factor $K_{ij}$ is a function of the modulus of elasticity, Poisson's ratio, and the associated contact angles of the two materials, as well as the thermal loading DT and the thermal expansion mismatch Da. However, the singularity parameter $\lambda$ is dependent only on the modulus of elasticity, Poisson's ratio, and the associated contact angles of the two adjacent materials. For certain material combinations and contact angles, the singularity parameter $\lambda$ could be equal to zero, thereby indicating that there is no singularity problem.

Figure 5:
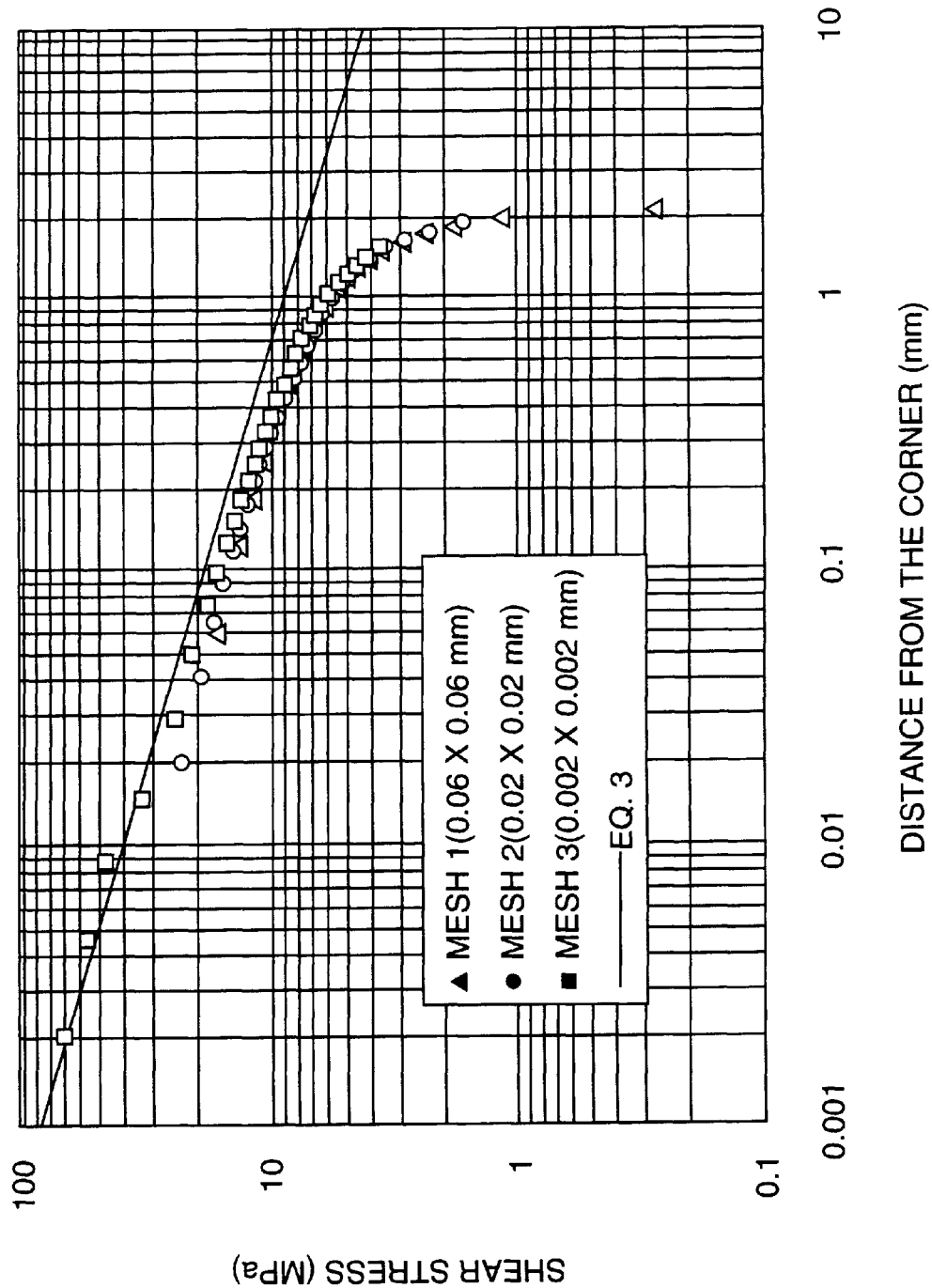
FIG. 5 is a plot showing the regressions of calculated shear stress to determine the stress singularity parameter and the shear stress intensity factor.
Figure 6:
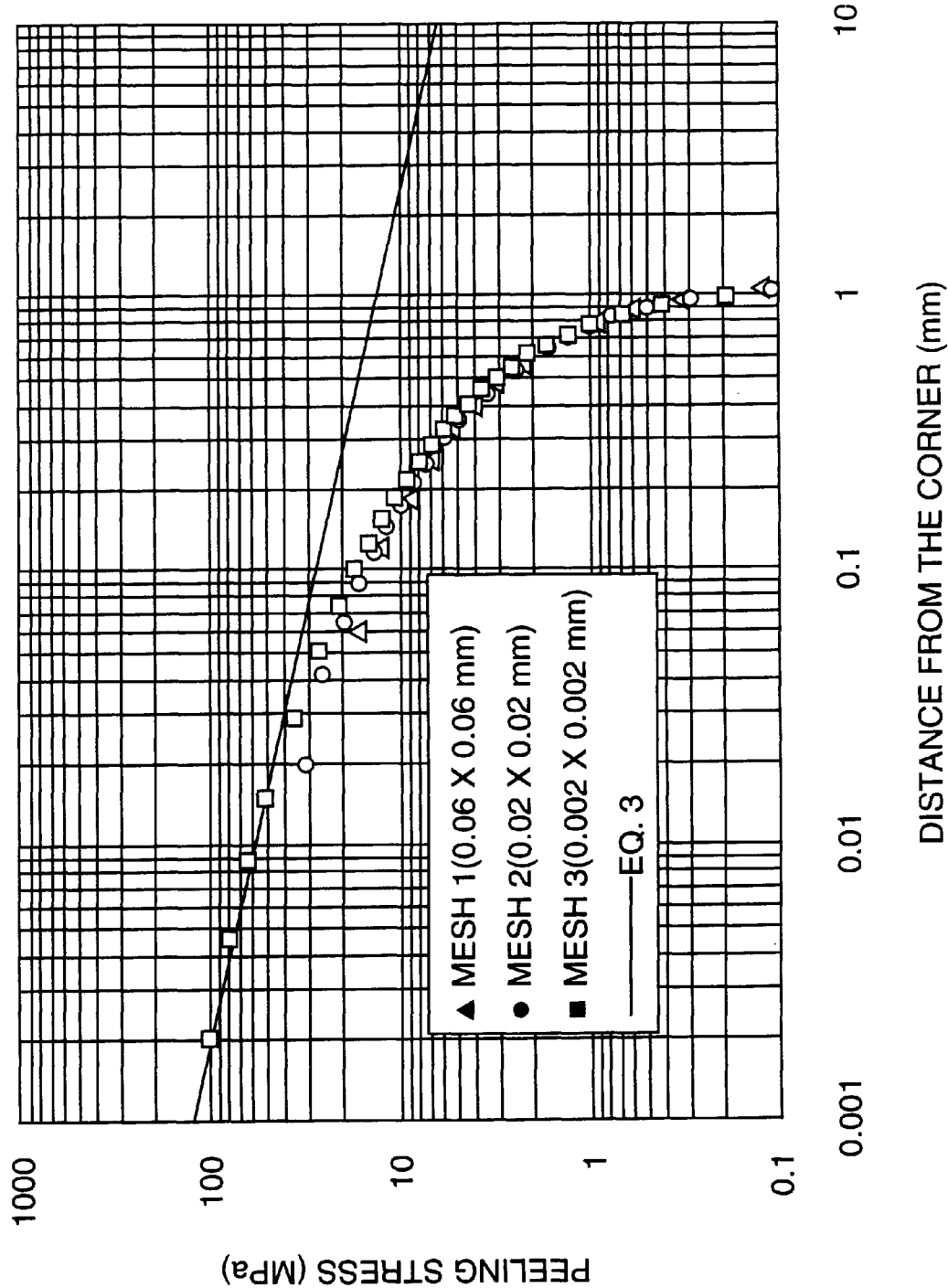
FIG. 6 is a plot showing the regressions of calculated peeling stress to determine the stress singularity parameter and the peeling stress intensity factor.

The singularity parameter $\lambda$ and the stress intensity factor K can be determined by fitting the results of the finite element analysis of the stress distribution curve, according to the following equation:

$$\lambda = \frac{\text{Log}\sigma_2 - \text{Log}\sigma_1}{\text{Log } r_2 - \text{Log } r_1} \quad K = \sigma_1 r_1^\lambda$$

where $r_1$ and $r_2$ are selected distances from the singular point, and $\sigma_1$ and $\sigma_2$ are corresponding stress values on the linear regression curve of the calculated peeling/shear stress in a log—log scale as illustrated in FIG. 5. For example, FIGS. 5 and 6 illustrate the log—log plots of the calculated peeling and shear stresses with three different finite element mesh sizes. The applied thermal loading is uniform in temperature from 165° C. to 30° C., the molding compound material is Hysol FP4510, and the lead frame material is HSM Copper C19400 (material combination 1 in Table 3). The analyses were conducted using ABAQUS software (Version 5.5, available from Hibbitt, Karlsson & Sorenson, Inc. located in Pawtucket, Rhode Island), as the failure effects analysis solver and PATRAN/P3 (Version 3.1, available from the MacNeal-Schwendler Corporation located in Southfield, Mich.), as the pre- and post-processing tools.

Selection of the Material System

According to the above equations, the following method of material selection should be followed:

(a) The stress singularity parameter X and the stress intensity factor K are used to evaluate the material selection in the package design process.

(b) The encapsulation material cannot be selected separately, because it must be selected in combination with the material selected for the lead frame because the stress singularity parameter $\lambda$ and the stress intensity factor K, which drive the force that produces the debonding or interface delamination, depends on the material properties for both encapsulation material and the lead frame material.

(c) The material combination (material system) is selected so that both the stress singularity parameter $\lambda$ and the stress intensity factor K are less than a minimum allowable value. The minimum allowable value of the stress singularity parameter and the stress intensity factor are determined from laboratory material tests.

Figure 7:
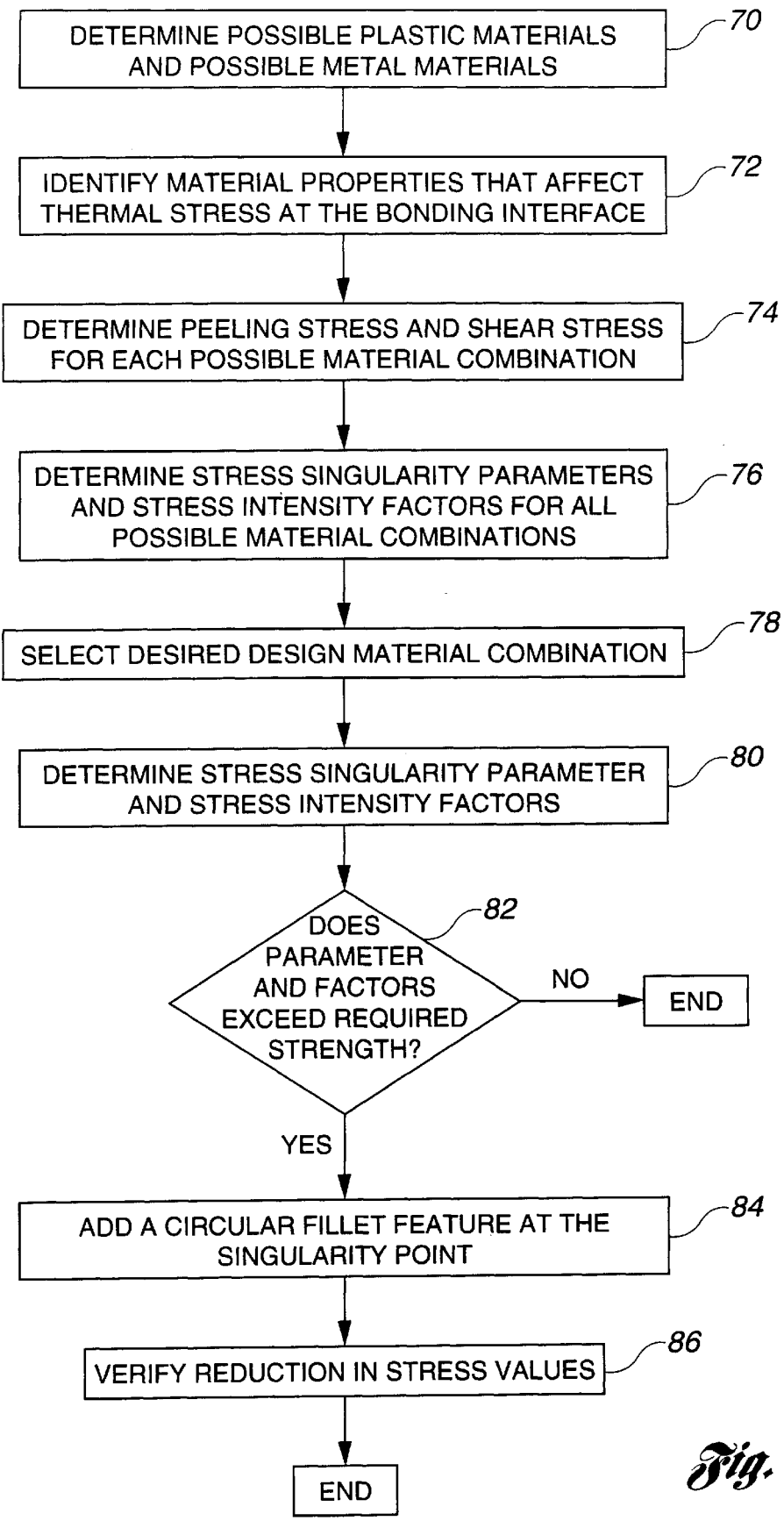
FIG. 7 is a flow diagram illustrating the general steps of the operation of the method of the present invention.

As shown in FIG. 7, the procedure for selecting the materials are:

(i) Within cost limitations and manufacturing constraints, determine possible plastic materials for encapsulation and the metal for the lead frame, as shown at block 70. Examples of possible materials are illustrated in Table 1.

(ii) Identify material properties that affect the thermal stress status at the interface bonding corner, as shown at block 72, including Young's Modulus, Poisson's Ratio, and the coefficient of thermal expansion (CTE).

(iii) For each possible combination of materials, calculate the peeling stress and shear stress at the bonding interface between the plastic and the lead frame utilizing the finite element method explained above, as shown at block 74.

(iv) Plot the calculated stress on a log—log scale, and determine the stress singularity parameters and the stress intensity factors for all possible material combinations, as shown at block 76.

(v) Select the desired design material combination based on the stress singularity parameter and the stress intensity factors, as shown at block 78.

TABLE 1

Material Properties

| | Material | Young's Modulus (GPa) | Poisson's Ratio | CTE (ppm/° C.) |
|---|---|---|---|---|
| Molding Compound 1 | Hysol FP4510 | 18.8 | 0.34 | 20.5 |
| Molding Compound 2 | Hysol MG47F | 13.8 | 0.34 | 14.0 |
| Molding Compound 3 | Sumitomo 6300HX | 11.8 | 0.35 | 17.0 |
| Lead Frame 1 | HSM Copper C19400 | 120.7 | 0.31 | 16.2 |
| Lead Frame 2 | Alloy 426 | 149.5 | 0.30 | 5.0 |

As a first illustrative example, Table 1 lists three molding compound materials and two lead frame materials. The combinations of these materials can form six pairs of possible interfaces. The material properties used for stress calculation are also listed in Table 1. The actual materials are not critical to the present invention, and are used only for purposes of example and illustration. Various other materials, both known and yet to be invented, may be evaluated using this methodology.

Figure 8:
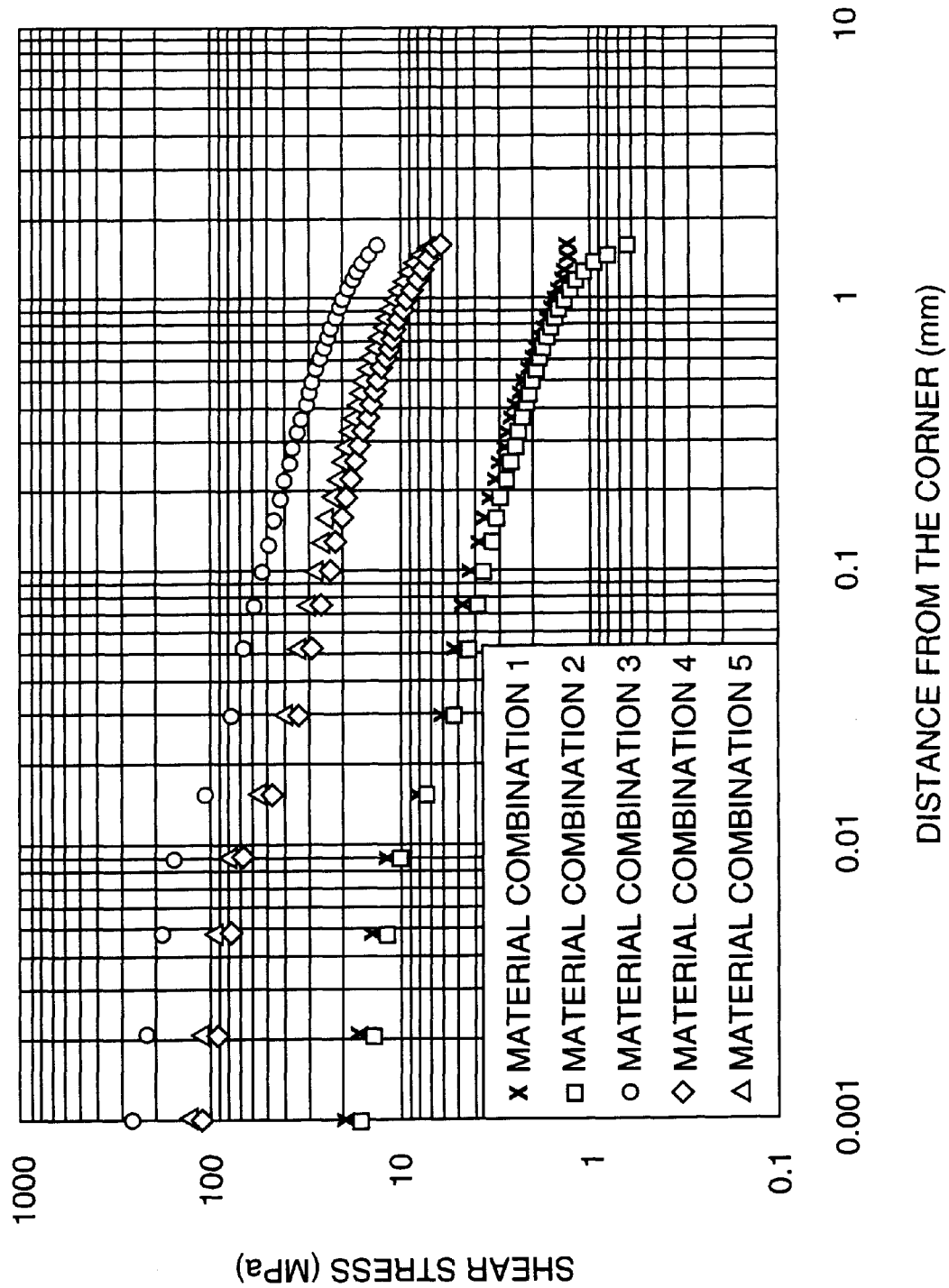
FIG. 8 is a plot showing the calculated shear stresses for different material combinations.
Figure 9:
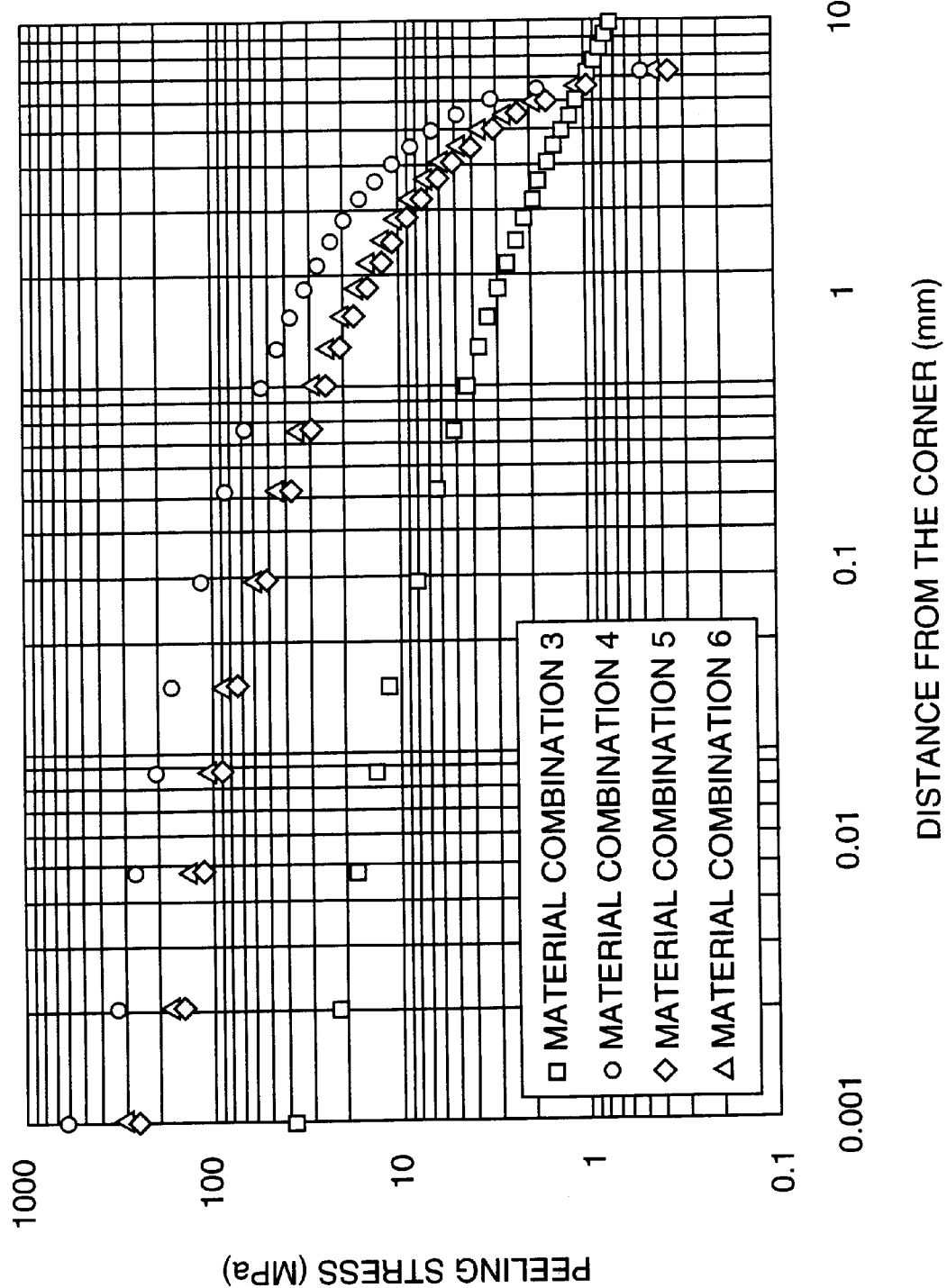
FIG. 9 is a plot showing the calculated peeling stresses for different material combinations.

The finite element analysis steps are performed for each material combination. The calculated results for material combination 1 are plotted in a log—log scale as illustrated in FIGS. 5 and 6, for shear stress and the peeling stress, respectively. The calculated results for material combination 2 to 6 are plotted in a log—log scale as shown in FIGS. 8 and 9, for shear stress and the peeling stress, respectively. According to the analysis explained in the previous section, the stress singularity parameters of these six material combinations are estimated and listed in Table 2 for design reference. Note that the peeling stress of material combination 2 is compressive with no crack initiation concern and, therefore, need not be plotted.

Table 2 suggests that material combinations 2 and 3 are good choices for preventing the interfacial crack initiation at the corner of the bonding interface because they have the lowest values of peeling stress and shear stress. Of the two material combinations listed in Table 2 having the lowest peeling stress and shear stress, material combination 2 should be selected since it has the lowest peeling stress, and the shear stress is comparable with that of material combination 3.

TABLE 2

Calculated Stress Singularity Parameters and Stress Intensity Factors for Six Possible Material Combinations

| Material Combination | Molding Compound Material | Lead Frame Material | Singularity Parameter | Peeling Stress Intensity Factor | Shear Stress Intensity Factor |
|---|---|---|---|---|---|
| 1 | Hysol FP4510 | HSM Copper | 0.315 | 13.9 | 11.0 |
| 2 | Hysol FP-4510 | HSM Copper | 0.310 | — | 2.7 |
| 3 | Sumitomo 6300HX | HSM Copper | 0.294 | 3.3 | 2.6 |
| 4 | Hysol FP4510 | Alloy 42 | 0.311 | 44.0 | 36.7 |
| 5 | Hysol MG47F | Alloy 42 | 0.301 | 19.0 | 16.9 |
| 6 | Sumitomo 6300HX | Alloy 42 | 0.305 | 22.6 | 19.8 |

Determination of the Fillet Radius

In many cases, the selection of material combinations may be limited due to cost and manufacturing constraints. Therefore, in determining the package design, the geometry of the radius of curvature between the molding compound 60 and the lead frame 50 must be optimized at the singularity point. The debonding or crack initiation are local phenomenon and, in many cases, the change of the geometry may be more effective in reducing the stress concentration factor because of the sensitivity of the stress to the local geometry.

Figure 10:
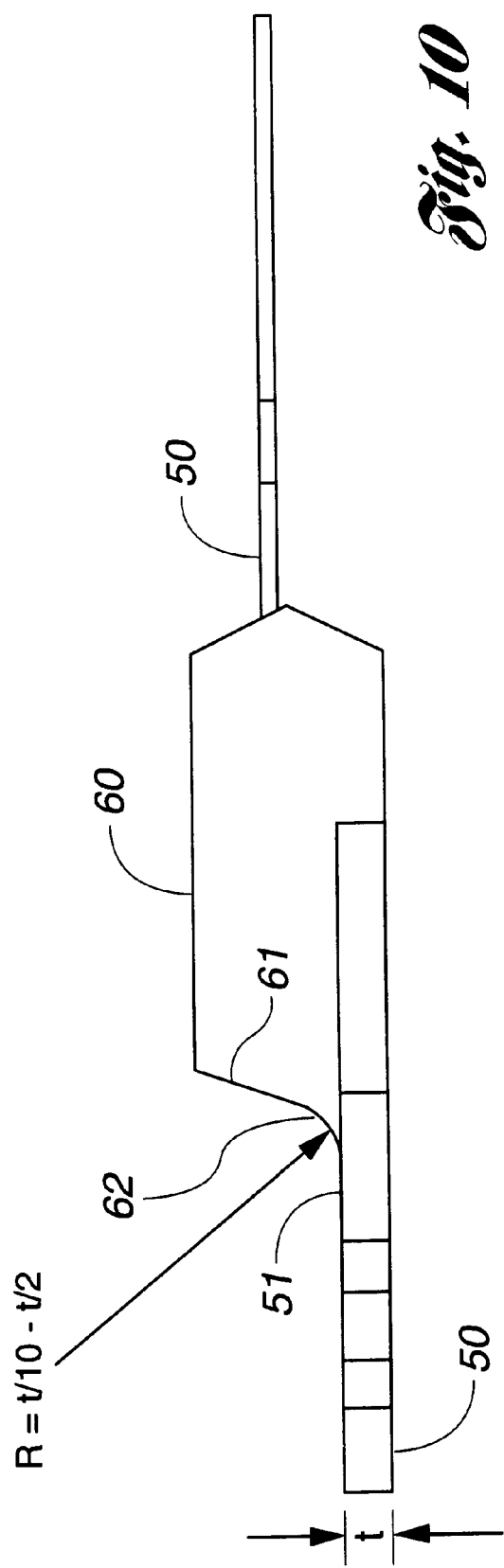
FIG. 10 illustrates a geometry of a plastic encapsulated power IC package incorporating the radius feature of the present invention.

In cases in which the material combination is limited, the design tradeoff may be resolved by adding a circular fillet feature at corner 62, as shown in FIG. 10, between the molding compound 60 and the lead frame 50. This circular fillet or radiused transition between the semi-vertical surface 61 of the molding compound 60 and the horizontal surface 51 of the upper surface of the lead frame 50 has not been heretofore used in power IC packaging. For many material combinations currently used in industry, adding this fillet feature will reduce the stress significantly, and the stress singularity may be reduced to the point that it becomes insignificant.

Figure 11:
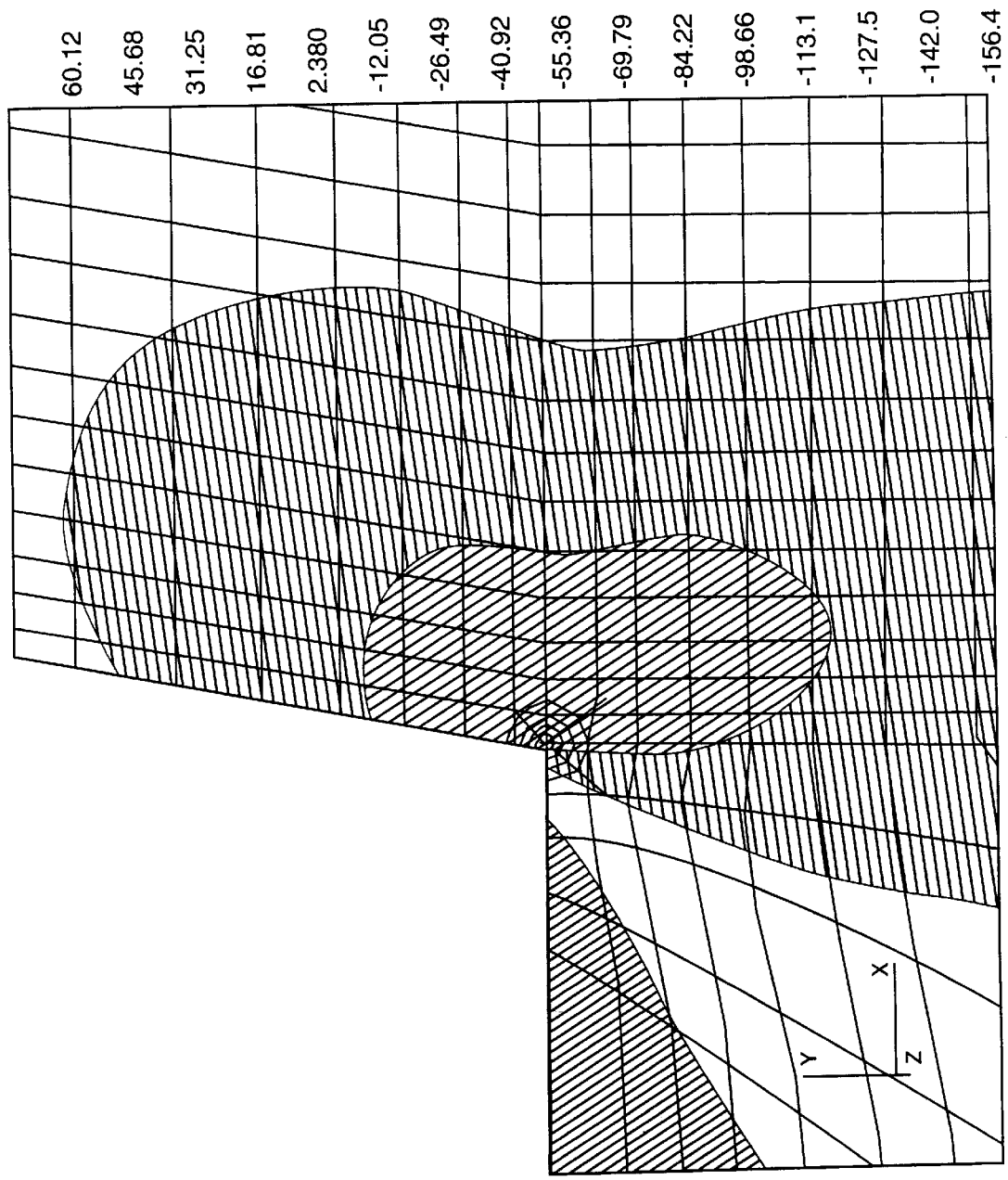
FIG. 11 is stress contour plot showing the stress concentration at the bonding corner.
Figure 12:
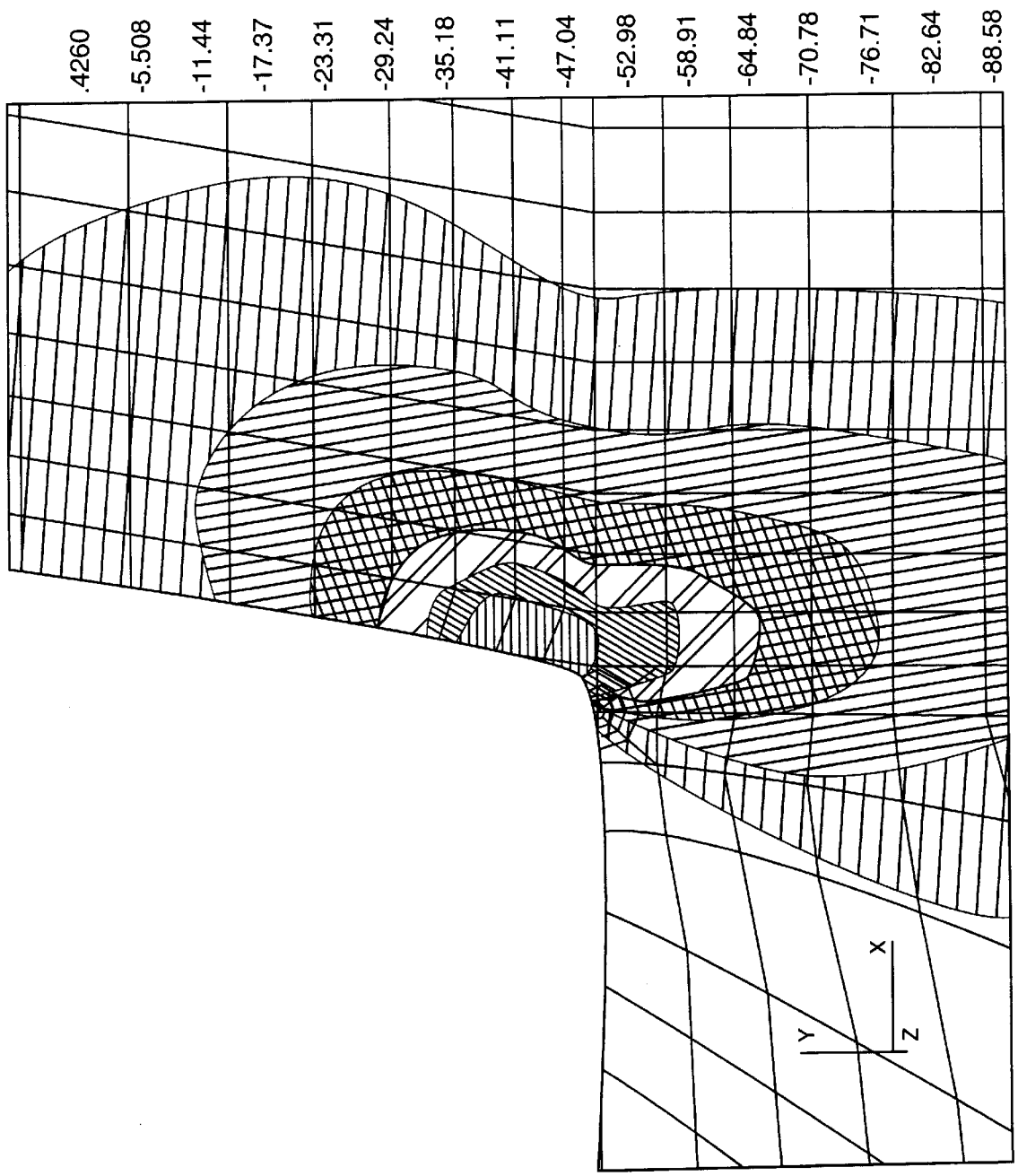
FIG. 12 illustrates a stress contour plot showing the release of the concentrated stress due to the fillet feature.
Figure 13:
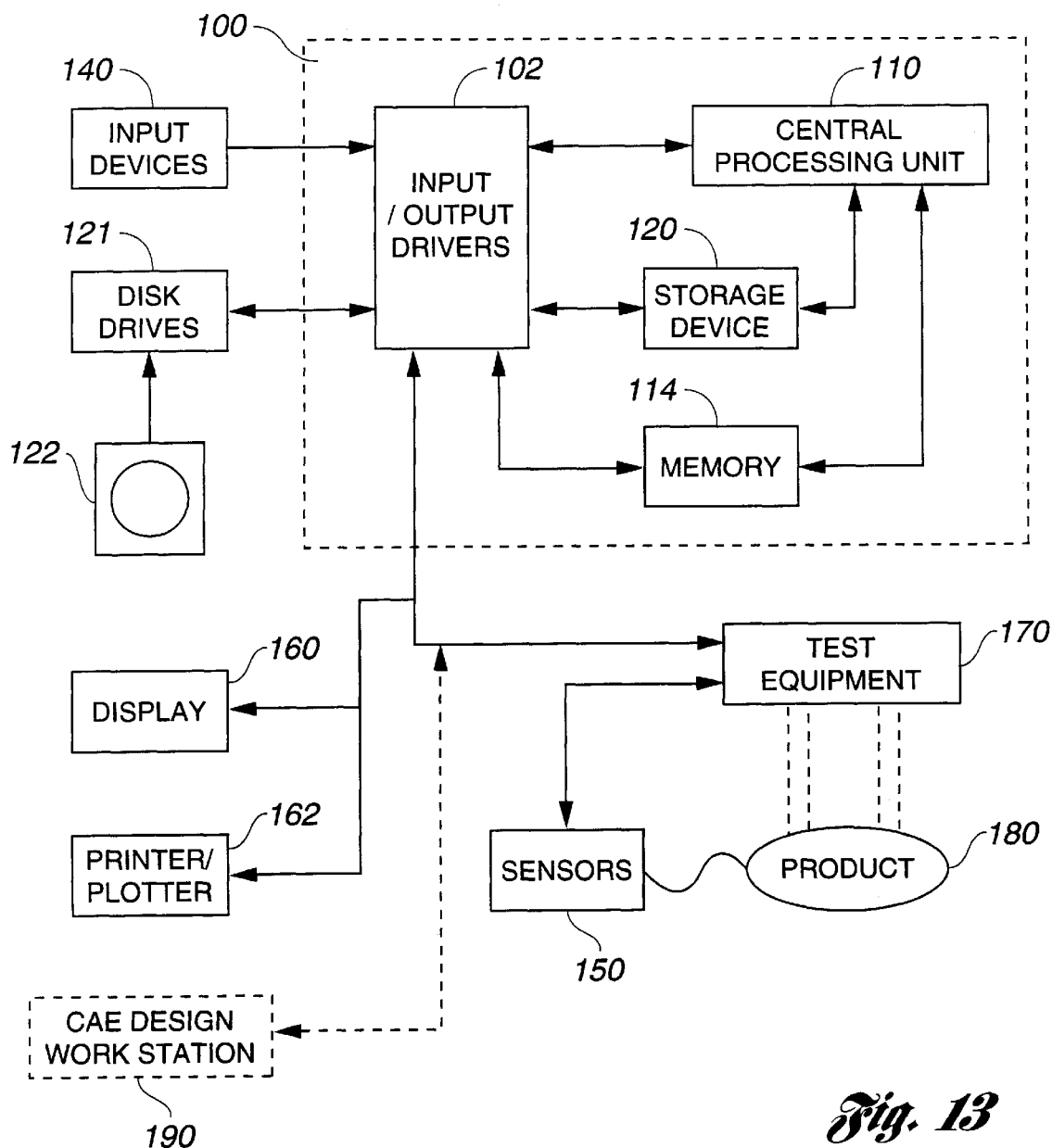
FIG. 13 illustrates a schematic block diagram of a computer and testing system for executing the testing method in accordance with the present invention.

For example, if a circular fillet with a radius R equal to 0.05 mm is utilized, with the material combination 1 as illustrated in Table 1, the highest peeling and shear stress points along the interface may be shifted away from the corner 62 sufficiently to prevent the debonding and cracking problems. FIG. 11 illustrates the overall stress contour, showing that the stress concentrates at the bonding corner 62. FIG. 12 shows the stress contour plot with the release of the concentrated stress due to the new radius or fillet feature. The comparison of these two plots illustrates that the stress concentration point is substantially dissipated through the redistribution of the stress along the circular fillet.

After the stress singularity has been reduced using the above methodology, the magnitude of the stress reduction due to the circular fillet in the package can be evaluated by comparing the critical stresses. Table 3 lists the calculated stresses at the interface corner 62 as determined utilizing finite element analysis and the percentage of the stress reduction.

TABLE 3

Comparisons of Critical Stresses

| | Peeling Stress at the Interface Corner (MPa) | Shear Stress at the Interface Corner (MPa) |
|---|---|---|
| Without Fillet | 55.9 | 27.0 |
| With Fillet | 6.9 | 10.7 |
| Stress Reduction | 87.6% | 60.4% |

An optimum value for the range of values for the radius of the fillet feature must be determined. There is no closed-form solution to describe the relationship between the radius of the fillet, the molding 60 and the dimensions of the lead frame 50. However, through the application of finite element analysis, the relationship, as well as the optimum radius valve, can be calculated numerically. That is, based on boundary constraints defined by the manufacturer of the IC, the engineer/designer performs a finite element analysis for each of the possible radius values.

By solving for the radius, it may be determined that the optimum radius for the circular fillet feature 62 ranges from between t/10 to t/2, where t is the thickness of the lead frame material. When the radius is less than t/10, the stress value may be large enough to cause crack initiation. When the radius approximates t/2, then the package size may be too big, and may increase the cost of the IC packages.

After the optimum value for the radius of the fillet feature is determined, the stress factors are then recalculated to assure that these factors are less than the critical values determined from the materials testing.

In summary, the design process may be summarized with the following process steps, as shown in FIG. 7:

(i) Determine the need for geometry change by calculating the stress singularity parameter and stress intensity factor, as shown at block 80. If the calculated values are greater than the required strength (the critical value inducing failure which is empirically determined during laboratory testing), a geometry change is required, as shown at conditional block 82.

(ii) Add a circular fillet feature with a radius in the range of t/10 to t/2, where t is the thickness of the lead frame, as shown at block 84.

(iii) Recalculate the stress and make sure that the calculated stress values are less than the required strength determined in material testing, as shown at block 86.

The method in accordance with the present invention may be implemented either on a special purpose computer/microcontroller or on the general purpose computer which is illustrated generally as 100 in FIG. 12. The computer 100 includes input/output driver circuitry 102 that receives data from input devices 140, various transportable magnetic storage media 122 and sensors 150. An example of input device 140 would be a computer keyboard. An example of transportable magnetic storage media include magnetic floppy disks and magnetic tapes that may be read through compatible drives 121, that in turn are coupled to either the input/output drivers 102 or directly to the storage device 120. An example of the sensors 150 would include thermalcouples, strain gauges, and the like.

The input/output drivers 102 are coupled to a central processing unit (CPU) 110 that performs calculations and other steps in accordance with the method described herein. An example of a CPU used for the present invention would be a PA-RISC 7200. The program that directs the central processing unit 110 is stored within a storage device 120, that may comprise a hard drive, a floppy drive, non-volatile memory or some other storage medium capable of recording and playing back algorithms and computer programs in accordance with the present invention. The storage device 120 also may include various physical parameters, distributions, materials data bases, environmental data bases, physical characterizations, etc., that are required during the execution of the computer program, and which may be stored and retrieved most efficiently on the storage device 120. The central processing unit 110 is also coupled to sufficient memory 114 for receiving and storing selected portions of the computer program and data being operated upon by the central processing unit 110. Other outputs of the input/output drivers 102 may be coupled to a system display 160, such as a CRT display, a plotter or printer 162, and to measurement equipment 170 that operates upon the product being tested 180.

It also may be possible to couple the output of a Computer Automated Engineering (CAE) workstation 190 to either the input device 140 or directly to the input/output drivers 102 of the computer 100. In this manner, CAE workstation designs, rather than actual prototype testing data, may be fed directly into the computer 100 for analysis and testing in accordance with the method of the present invention. In a similar manner, it may also be possible to couple the input/output drivers 102 directly to the CAE workstation so that results of the testing and analysis may be coupled directly to the product design being developed in the CAE workstation so that appropriate product design parameters may be adjusted in accordance with the test results. It also may be possible to simulate the testing methodology on a CAE workstation using finite element analysis techniques rather than building a prototype and testing it on the test equipment 170 and with the sensors 150 as discussed above. This simulation may be accomplished either on the computer 100, or a computer program in accordance with the teachings of the present invention, or may be incorporated as a module into the software used in the CAE workstation to design and analyze the product. Under these circumstances, the computer program in accordance with the present invention would probably be executed directly upon the CAE workstation 190.

While the best mode of the present invention has been described in detail, one skilled in this art will be capable of numerous variations, modifications and adaptations without departing from the spirit and scope of the present teachings. It should be understood that the present invention is not limited to the processes, embodiments or examples contained herein, but are limited only by the scope of the following claims.

What is claimed is:

1. A method for designing an IC package having a plastic encapsulated portion and a lead frame portion that are bonded together at a bonding interface, the method comprising:

selecting material candidates for the plastic encapsulated portion;

selecting material candidates for the lead frame portion;

determining a peeling stress and a shear stress at the bonding interface for a plurality of combinations of material candidates; and selecting a design material combination from the plurality of combinations of material candidates based on the peeling stress and the shear stress.

2. The method as recited in claim 1 wherein determining the peeling stress and the shear stress includes performing a finite element analysis on each of the plurality of combinations of material candidates at the bonding interface.

3. The method as recited in claim 2 wherein performing the finite element analysis includes identifying material properties for each of the material candidates that affect thermal stress at the bonding interface.

4. The method as recited in claim 2 wherein determining the peeling stress and the shear stress further includes performing a linear regression.

5. The method as recited in claim 4 wherein determining the peeling stress and the shear stress further includes determining a stress singularity parameter and a stress intensity factor for each of the material combinations based on the linear regression.

6. The method as recited in claim 5 wherein selecting the design material combination further includes comparing the stress singularity parameter and the stress intensity factor to a predetermined stress singularity parameter threshold and a predetermined stress intensity factor threshold.

7. The method as recited in claim 1 further comprising:

determining a singularity point at the bonding interface of the design material combination having the highest stress; and adding a circular fillet feature at the singularity point, the circular fillet feature having a radius sufficient to reduce the stress, the radius determined from a range of possible radii.

8. The method as recited in claim 7 wherein the radius is determined by determining a peeling stress and a shear stress at the singularity point.

9. The method as recited in claim 8 wherein determining the peeling stress and the shear stress includes performing a finite element analysis at the singularity point.

10. A method for designing an IC package having a plastic encapsulated portion and a lead frame portion that are bonded together at a bonding interface, the method comprising:

determining a singularity point at the bonding interface having the highest stress; and adding a circular fillet feature at the singularity point, the circular fillet feature having a radius sufficient to reduce the stress, the radius determined from a range of possible radii.

11. The method as recited in claim 10 wherein the radius is determined by determining a peeling stress and a shear stress at the singularity point.

12. The method as recited in claim 11 wherein determining the peeling stress and the shear stress includes performing a finite element analysis at the singularity point.

* * * * *